United States Patent [19]

Hale et al.

[11] 4,121,152
[45] Oct. 17, 1978

[54] METHOD AND APPARATUS FOR TRACING ELECTRICAL CABLES

[76] Inventors: Edgar C. Hale, 1261 Via Esperanza, San Dimas, Calif. 91173; Stephen R. Troy, 104-20 89th Ave., Richmond Hill, N.Y. 11418

[21] Appl. No.: 687,284

[22] Filed: May 17, 1976

[51] Int. Cl.² ........................................... G01R 19/16
[52] U.S. Cl. ....................................................... 324/66
[58] Field of Search ................... 324/126, 66, 67, 51, 324/52, 127

[56] References Cited

U.S. PATENT DOCUMENTS

| | | | |
|---|---|---|---|
| 3,263,164 | 7/1966 | Solgere | 324/51 |
| 3,623,142 | 11/1971 | Key | 324/66 |
| 3,810,003 | 5/1974 | Portoulas | 324/66 |
| 3,829,765 | 8/1974 | Siler | 324/67 |
| 3,982,181 | 9/1976 | Ferony et al. | 324/66 |

*Primary Examiner*—Rudolph V. Rolinec
*Assistant Examiner*—Ernest F. Karlsen
*Attorney, Agent, or Firm*—Joseph E. Rusz; Jacob N. Erlich

[57] ABSTRACT

A system for tracing electrical cables within a building utilizing in combination a pulsing electrical load and a standard clamp-on type ammeter. In operation the intermittent current flow can easily be detected and cables can readily be traced from outlet to circuit breaker. The novel pulsing electrical load draws current at a characteristic rate that is independent of the amount of current drawn, so that various load resistances can be used, to suit the circuit being traced. If desired, the standard clamp-on ammeter could be replaced by a detector designed for use with the pulsing load.

1 Claim, 2 Drawing Figures

METHOD AND APPARATUS FOR TRACING ELECTRICAL CABLES

STATEMENT OF GOVERNMENT INTEREST

The invention described herein may be manufactured and used by or for the Government for governmental purposes without the payment of any royalty thereon.

BACKGROUND OF THE INVENTION

This invention relates generally to a method and apparatus for tracing cables and, more particularly, to a system which utilizes a pulsing electrical load in combination with a standard clamp-on type ammeter for quickly, conveniently and reliably tracing electrical cables within a building.

Over the years the electrical power wiring diagrams and drawings for building can become either lost or obsolete. After a period of time, when it becomes necessary to perform electrical work within the building or to rearrange the rooms therein, it becomes difficult to determine which circuit breaker controls a specific outlet within the building.

Heretofore, there have been basically two procedures by which to trace the electrical cables within a building and reestablish an electrical wiring diagram:

(1) the most obvious way in which to trace these circuits would be to plug a lamp into the outlet in question and switch the circuit breakers off momentarily, in turn, until the lamp within the outlet goes off. Unfortunately, this method is annoying for workers if used during normal office hours. For example, such a method could conceivably pose an extreme safety hazard when, for instance, an improper outlet has been momentarily shut off and a heavy object is being lifted by workers in a suddenly darkened area. Furthermore, the interruption of power may be extremely harmful to office equipment, such as copying machines. Finally, the above method may not even work in an efficient manner, since, if the controlled outlet is very far, or around corners, from the circuit breaker the operation of the outlet in question would be hard to monitor; and (2) metal detectors or the like can be used to trace cables within the walls of building under certain circumstances. Unfortunately, this apparatus yields an uncertain approach when the cables in question are crowded together.

What is needed is an electrical cable tracing system which is extremely reliable in the tracing of electrical circuits and in addition provides a minimum of inconvenience to those who are involved in utilizing outlets which are not a problem.

SUMMARY OF THE INVENTION

The instant invention sets forth a pulsing electrical load, together and in combination with a conventional clamp-on ammeter or the like in order to successfully trace electrical cables within a building and thereby overcome the problems set forth hereinabove.

The function of the pulsing electrical load is to draw a current at a pulsing rate, producing a characteristic "wiggle" on the ammeter which has been clamped about the cable supplying the current. In operation, the electrician plugs the pulsing load into the outlet in question, and then goes to the circuit breaker box and clamps the ammeter sequentially around every cable. The cable feeding the outlet under investigation and to which the pulsing load is connected will show a fluctuation in its reading. Systematic use of this procedure allows all cables to be identified and has the advantages of: (1) no disruption of normal work, (2) only one man is needed for the procedure; (3) the pulsing load can be very inexpensively built and can be used in conjunction with a conventional ammeter; and (4) no special training is required for its use.

In addition to the above features the pulsing electrical load incorporates therein an electrical circuit which is totally independent of load current (a concept entirely different from thermal relay devices) and therefore the load utilized therewith can be chosen to give a convenient indication on the ammeter.

It is therefore an object of this invention to provide a method for reliably and economically tracing the electrical cables and circuits.

It is a further object of this invention to provide a pulsing electrical load which can be utilized in combination with a conventional ammeter for performing the above operation.

It is still another object of this invention to provide a pulsing electrical load which is totally independent of load size.

It is a still further object of this invention to provide a system for tracing electrical cables within a building which lends itself to standard mass producing and manufacturing techniques.

For a better understanding of the present invention together with other and further objects thereof reference is now made to the following description taken in conjunction with the accompanying drawing and its scope will be pointed out in the appended claims.

DETAILED DESCRIPTION OF THE PREFERRED EMBODIMENT

Figure 1:
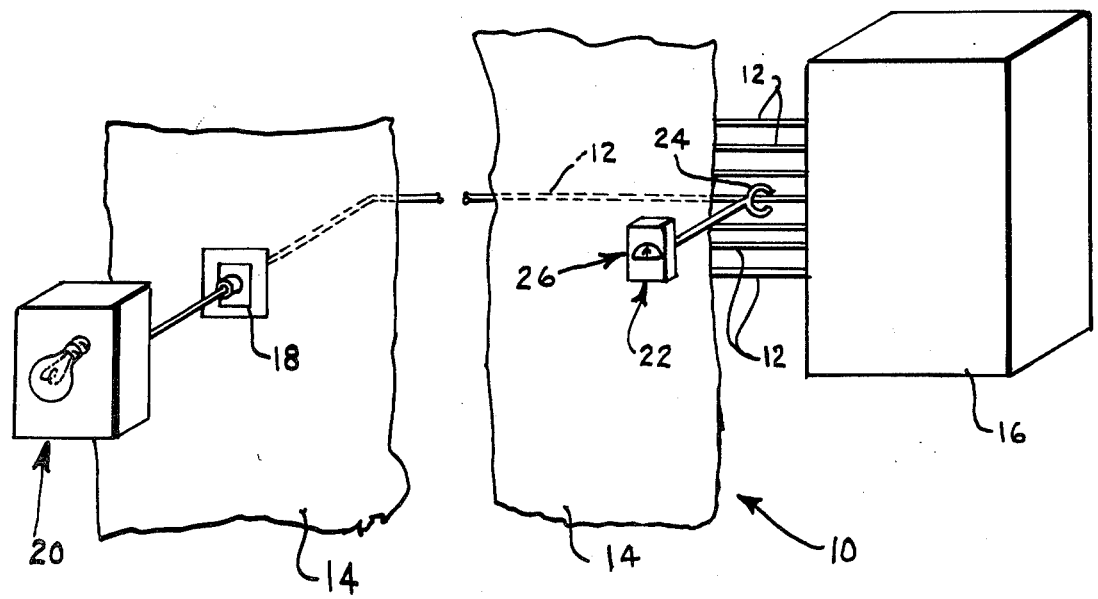
FIG. 1 is a pictorial representation of the system of this invention capable of tracing the electrical cables within a building.

Reference is made to FIG. 1 of the drawing which discloses in pictorial fashion the system 10 of this invention which enables swift and reliable tracing of electrical cables 12 within a building. Generally these cables 12 are numerous in number and are located behind the walls 14 within a building. It is necessary in some instances to determine which circuit breaker within a circuit breaker box 16 is connected to a particular outlet 18. Unfortunately, if the circuit or wiring diagram of the building is no longer available, systems heretofore in existence have proven to be both a tedious and unreliable operation.

System 10 of the instant invention utilizes a pulsing electrical load 20 which is plugged into the outlet 18 in question. The operator or electrician after connecting the pulsing electrical load 20 to the outlet 18 goes to the area of the building in which the circuit breaker box 16 is located. Utilizing a conventional clamp-on ammeter 22 or the equivalent, the electrician places the clamp 24 of ammeter 22 about each cable. When the clamp 24 on ammeter 22 is around the cable which is connected to outlet 18 in which the pulsing electrical load 20 is connected a characteristic "wiggle" registers on the ammeter scale 26 and the electrician now knows to which circuit breaker outlet 18 is connected.

Figure 2:
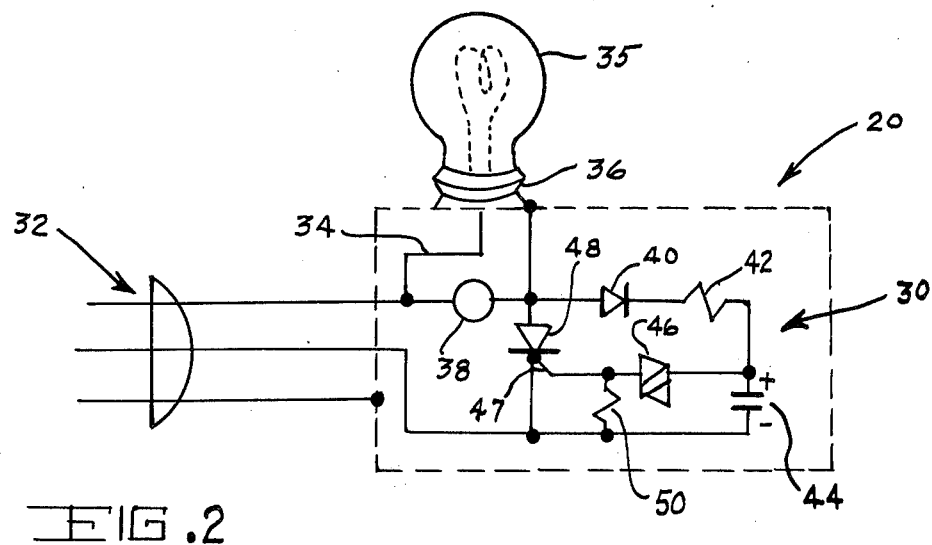
FIG. 2 is a schematic diagram of the electrical circuit of the pulsing electrical load of this invention.

Reference is now made to FIG. 2 of the drawing which illustrates in schematic fashion the electrical circuit 30 making up the pulsing electrical load 20. Electrical load 20 incorporates therein a conventional three prong grounding plug 32. Plug 32 is electrically connected by line 34 to a conventional screw in type lamp socket 36, preferably of a heat resisting type. A neon pilot light 38, which includes a current limiting resistor, is connected in parallel across socket 36 thereby providing a visible indication of the operative condition of circuit 30. This indication is unnecessary when a standard incandescent lamp 35 is located within socket 36 since the lamp itself would also provide a visual indication. However, if an electrical heater element is used in place of incandescent lamp 35 as described hereinbelow, no visual indication is available and therefore pilot light 38 provides such an indication.

Continuing a description of circuit 30, calls for a conventional rectifier diode 40 for converting the AC current to DC. Diode 40 being of the type designated by the Electronics Industries Association (EIA) as No. 1N6080. Any other type, however, may be substituted therefore which equals or exceeds a reverse voltage rating of 200V and a forward current rating of 200MA.

A resistor 42 is electrically connected to diode 40. Resistor 42 has a value of 10 Kohm, ½W. In combination with resistor 42 is a conventional capacitor 44 having a value of 100 microfared, 50VDC, and therewith forms a timing delay for circuit 30. Capacitor 44 is electrically connected to a conventional silicon trigger diode 46 having an RCA No. 45411 and a trigger voltage of about 30V. A conventional silicon controlled rectifier (SCR) 48 having the EIA No. 2N686 is electrically connected to diode 46. Any other type of SCR may be used that blocks 200V or more. Another resistor 50 is utilized in circuit 30 solely to minimize the likelihood of SCR 48 being triggered by a noise burst or other transients.

In operation, upon the insertion of a 100 watt incandescent bulb 35 within socket 36, for example, and the insertion of plug 32 within outlet 18, current will flow through diode 40 and resistor 42 thereby charging capacitor 44. When enough voltage crosses capacitor 44 it will cause diode 46 to switch to the conducting state and allow the charge from capacitor 44 to flow into the gate electrode 47 of rectifier 48 thereby turning on SCR 48 and applying power to load 35. When SCR 48 turns on a short circuit is produced and no more current flows through diode 40 and onto capacitor 44. This limits the charge in capacitor 44 to the supply stored therein. After this charge is expended, the next negative going power line half-cycle turns off SCR 48. This halts the current through load 35. It also removes the short circuit mentioned above, allowing current again to flow through diode 40 and resistor 42, repeating the cycle described above. This operation produces a pulsing electrical load which intermittently allows current to pass therethrough. The magnitude of such current depends solely on the resistance of load 35. Therefore with the instant invention a load 35 can be chosen to give a convenient indication on ammeter scale 26. For example, suppose the current through a cable 12, drawn by normal loads, were a constant 9 amperes. It would then be convenient to use ammeter 22 on its 15 ampere range. A choice of a conventional 100 watt incandescent bulb for load 35 would produce a pulsing current of about one ampere, easily observable on ammeter 22. However, suppose instead that there is a normal current through cable 12 of 500 amperes, then ammeter 22 would be used on its 600 ampere range. As a result a 1000 watt electrical heater element (of the conical ceramic type wound with coiled resistance wire that screws into socket 36) could be used for load 35, giving a pulsing current of about 15 amperes, again easily observable on ammeter 22. The maximum pulsing load current that can be sustained by the instant invention is determined by the current rating of SCR 48. Also, if high power loads are used with this invention a wire guard could be installed over the load to protest users from possible burns.

As described above, the instant invention produces current pulses whose magnitude is determined by load resistance 35, but whose timing is completely independent of such magnitude. Therefore, if desired, ammeter 22 could be replaced by a special detector, which could be built to respond only to the characteristic current pulses produced by the instant invention.

Although this invention has been described with reference to a particular embodiment, it will be understood to those skilled in the art that this invention is also capable of a variety of alternate embodiments within the spirit and scope of the appended claims.

We claim:

1. A method of tracing electrical cables between an outlet and a circuit breaker, said method comprising the steps of electrically connecting a pulsing electrical load means having a load element, a silicon controlled rectifier for connecting and disconnecting the load across the outlet, a diode, a resistor and a capacitor forming a time delay circuit connected across the outlet and a voltage sensitive silicon trigger diode switch responsive to the voltage level on the time delay circuit for triggering the silicon controlled rectifier to said outlet, adjusting the amount of additive current passed by said pulsing load to a value proportional to the existing load current in said cables whereby said additive current can be readily detected, placing a clamp-on ammeter sequentially about each of a plurality of said cables and detecting a fluctuation in current flow with said clamp-on ammeter corresponding to the fluctuation in current being drawn by said pulsing load while said clamp-on ammeter is clamped about said cable.

* * * * *